United States Patent [19]

Fujita

US005206890A

[11] Patent Number: 5,206,890
[45] Date of Patent: Apr. 27, 1993

[54] COUNTER CIRCUIT WITH DIRECTION OF COUNT INDICATION

[75] Inventor: Atsushi Fujita, Hachioji, Japan
[73] Assignee: Fujitsu Limited, Kawasaki, Japan
[21] Appl. No.: 723,078
[22] Filed: Jun. 28, 1991
[30] Foreign Application Priority Data
  Jun. 29, 1990 [JP] Japan .................... 2-174283
[51] Int. Cl.[5] .................... H03K 21/02; H03K 21/08; H03K 21/18
[52] U.S. Cl. .................... 377/45; 379/55; 379/56
[58] Field of Search .................... 377/45, 126, 56, 55, 377/20

[56] References Cited

U.S. PATENT DOCUMENTS

| | | | |
|---|---|---|---|
| 4,532,643 | 7/1985 | Thompson | 377/45 |
| 4,628,521 | 12/1986 | Nishimura et al. | 377/45 |
| 4,881,248 | 11/1989 | Korechika | 377/45 |
| 4,982,413 | 1/1991 | Hauck et al. | 377/45 |

Primary Examiner—John S. Heyman
Attorney, Agent, or Firm—Nikaido, Marmelstein, Murray & Oram

[57] ABSTRACT

A counter circuit comprises a signal detector for providing an up/down indication signal and a count clock signal according to an up/down signal and a reference clock signal. A n-bit counter for providing up/down count data of "n" bits according to the up/down indication signal and count clock signal. A counting direction detector provides a counting direction signal according to the up/down indication signal and reference clock signal. This counter circuit itself determines whether it is counting up or counting down, by hardware, and thus can instantaneously respond to a direction identification request from a central processing unit.

12 Claims, 10 Drawing Sheets

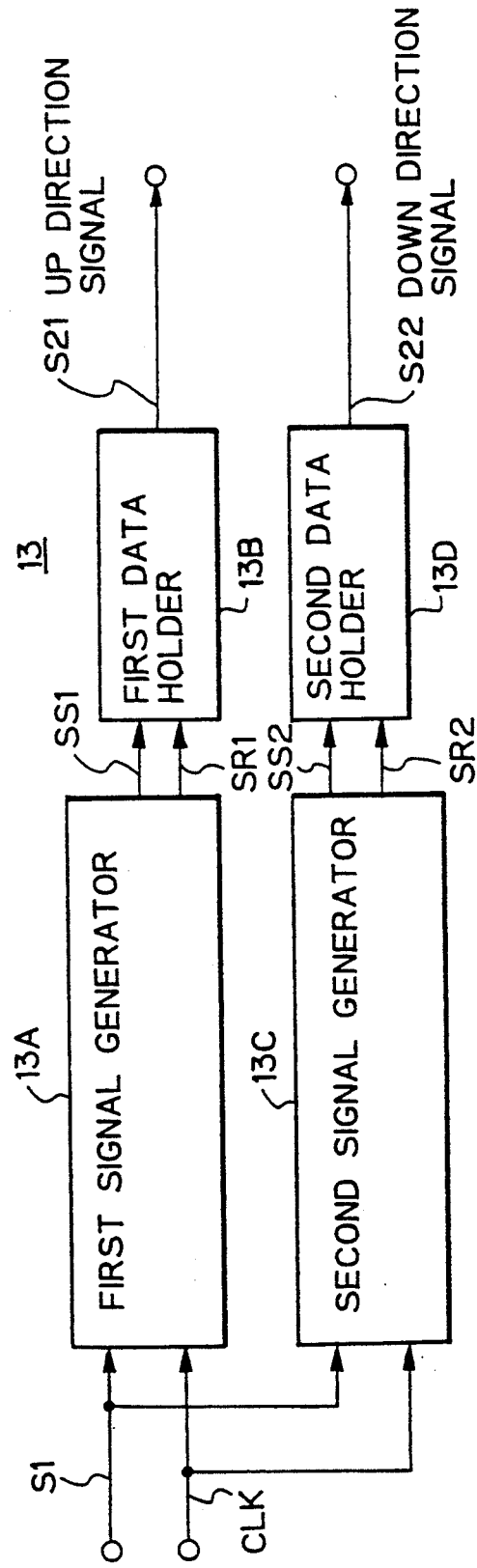

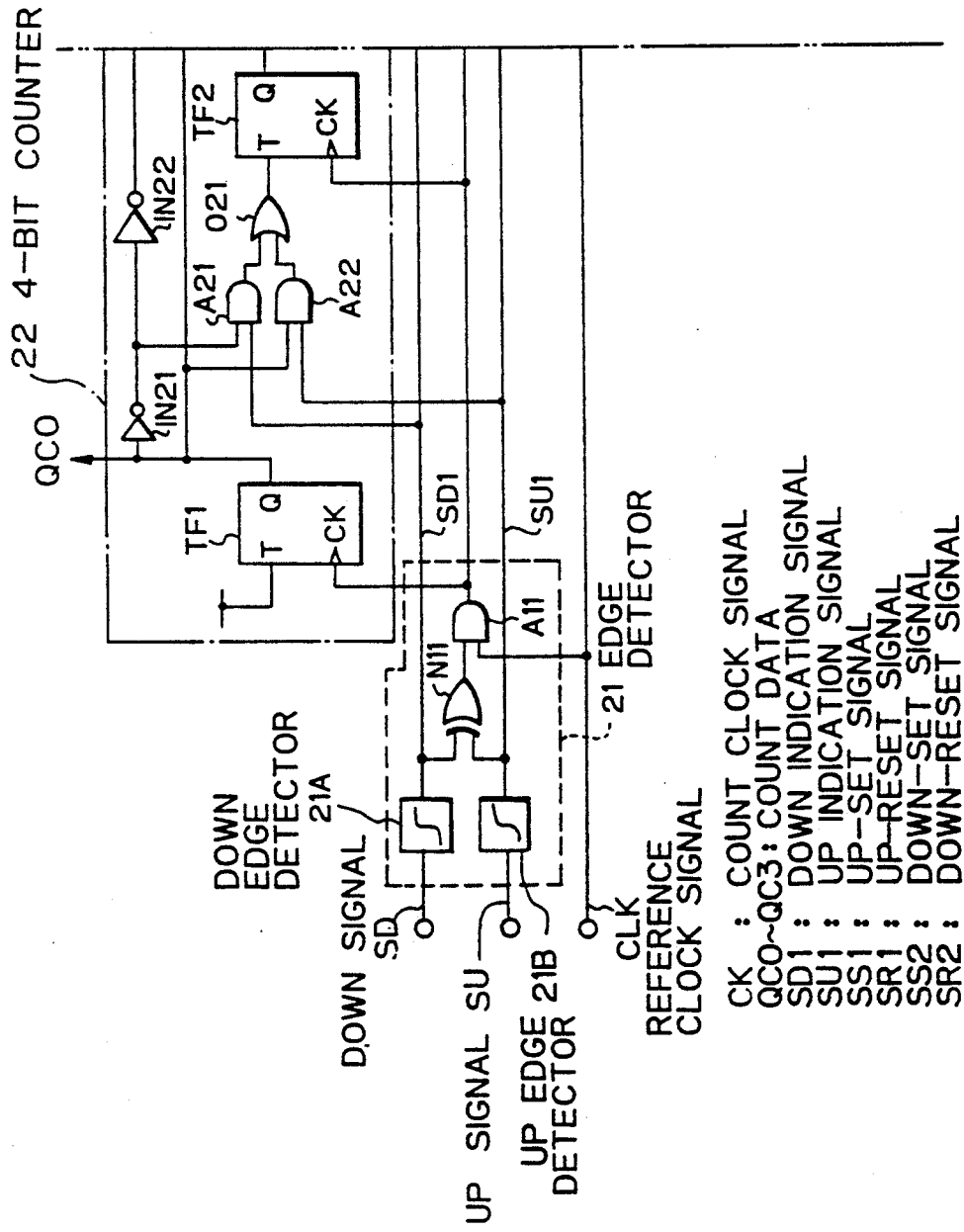

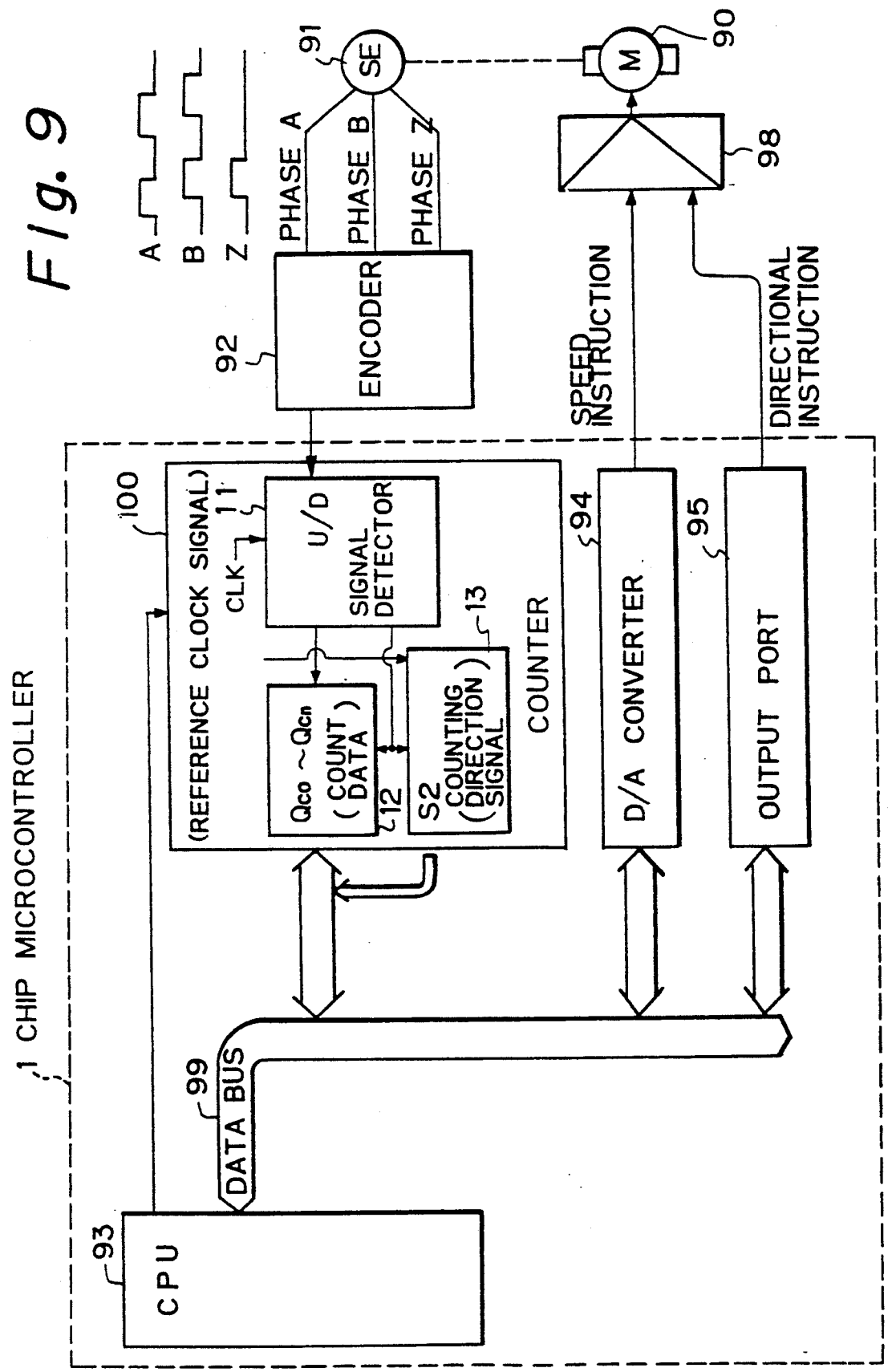

COUNTER CIRCUIT WITH DIRECTION OF COUNT INDICATION

BACKGROUND OF THE INVENTION

1. Field of the Invention

This invention relates to a counter circuit, and particularly to a circuit for detecting the direction in which a counter is counting, i.e., whether the counter is counting up or down.

2. Description of the Related Art

As the demand for an improved speed and efficiency of the control technology of microcomputers increases, many functions now carried out by software are being gradually replaced with hardware.

For example, a counter serving as a peripheral circuit of a microcomputer for controlling the position of a motor will be explained. To identify the direction of rotation of the motor (a moving object), a CPU of the microcomputer refers to count data provided by the counter, and whenever this directional information is needed, the CPU issues an interrupt request to obtain the count data, and processes the obtained count data. In this case, the CPU must sample the count data at least twice and calculate a difference in the sampled data to detect the direction of movement of the moving object (the motor). This technique imposes a heavy load on the software of the CPU, thereby hindering the execution by the CPU of other programs, and thus extending the period needed for identifying the direction of movement the moving object.

FIG. 1 shows a conventional up/down counter, and the operation and arrangement of this counter will be explained with reference thereto. The up/down counter 100 is used for controlling, for example, the position of a motor, and comprises an edge detector 1 and a 4-bit counter 2.

The edge detector 1 includes a down-edge detector 1A, an up-edge detector 1B, an exclusive or logic circuit N11, and an AND logic circuit A11.

The 4-bit counter 2 includes four T-type flip-flops TF1 to TF4 connected to a bus line (not shown), inverters IN21 to IN23, AND logic circuits A21 to A28, and OR logic circuits O21 to O23, in which the inverters and AND and OR logic circuits serve as carry bit detecting elements.

FIG. 2 is a time chart showing the function of the up/down counter 100. The up/down counter 100 detects an up indication signal SU2 or a down indication signal SD2 according to a reference clock signal CLK and an up signal SU or a down signal SD, provides a count clock signal CK in response to the detected signal SU2 or SD2, and according to the count clock signal CK, provides 4-bit count data QC0 to QC3 with which a CPU (not shown) controls the position of the motor.

According to this conventional technique, the CPU must rely on software to determine whether the up/down counter 100 is counting up or down, when identifying the direction of rotation of the motor, and this process takes a long time because the CPU must monitor changes in the count data for a predetermined period, and sample at least two data. This imposes a heavy load on the software of the CPU and thus hinders the execution of other programs thereby.

Whenever a motor position control system requests an identification of the direction of rotation of the motor, the CPU issues an interrupt request to process the count data QC0 to QC3 provided by the up/down counter 100. For example, the CPU samples the count data twice at an optional timing and finds a difference between the sampled data. If the difference X is X<0, the CPU determines that the direction of the normal direction, and if X>0, determines that the direction of the counter is downward, i.e., the motor is rotating in a reverse direction.

Referring to the time chart of FIG. 2, when the 4-bit counter 2 receives the count clock signal CK while the up indication signal SU2 is ON, the count data QC0 to QC3 will be 1, 0, 0, and 0, respectively, and this state is held until the 4-bit counter 2 receives the next down indication signal SD2. In response to reception of the down indication signal SD2, the count data QC0 to QC3 become 0, 1, 1, and 1, respectively. To find the direction of movement of the moving object (the motor), the CPU issues interrupt requests to sample the count data QC0 to QC3 at at least two different temporal points. If the count data at each sampling point is 1, 0, 0, and 0, the CPU determines that the moving object is moving in a count-up direction, and if the data of each sampling point is 0, 1, 1, and 1, it is moving in a count-down direction. With this kind of detection method using software, it takes a long time to identify the direction of movement, which lowers the speed of the control of the moving object and does not allow a reduction of the size of a control program.

Therefore, there is a demand for a counter circuit using hardware to detect a count-up signal or a count-down signal indicating the direction of movement of a moving object, and to instantaneously provide a CPU with the direction of movement information as and when requested, to thus reduce the load on the software of the CPU.

SUMMARY OF THE INVENTION

To meet this demand, an object of the invention is to provide an up/down counter that detects a count-up direction or a count-down direction by hardware, and instantaneously responds to a request from a CPU for an identification of the count direction, to thereby reduce the load on the software of the CPU.

To accomplish this object, the invention, as shown in FIGS. 3(a)-3(b), provides a counter circuit basically comprising:

a signal detector (11) for providing an up/down indication signal (S1) and a count clock signal (CK) according to an up/down signal (U/D) and a reference clock signal (CLK); an n-bit counter (12) for providing up/down count data (QC0 to QCn) of "n" bits according to the up/down indication signal (S1) and count clock signal (CK); and a counting direction detector (13) for providing a counting direction signal (S2) according to the up/down indication signal (S1) and reference clock signal (CLK).

The counting direction detector (13) includes: a first signal generator (13A) for providing a first set signal (SS1) and a first reset signal (SR1) in response to the up/down indication signal (S1) and reference clock signal (CLK); a first data holder (13B) for receiving the first set signal (SS1) and first reset signal (SR1) and providing an up direction signal (S21); a second signal generator (13C) for providing a second set signal (SS2) and a second reset signal (SR2) in response to the up/down indication signal (S1) and reference clock signal (CLK); and a second data holder (13D) for receiving the second set signal (SS2) and second reset signal (SR2) and providing a down direction signal (S22).

In this way, the invention employs a counting direction detector 13 that includes the first signal generator 13A, first data holder 13B, second signal generator 13C, and second data holder 13D.

Upon receiving the up/down signal U/D and reference clock signal CLK, the signal detector 11 feeds the up/down indication signal S1 and count clock signal CK to the n-bit counter 12 and to the counting direction detector 13, and according to the up-down indication signal S1 and count clock signal CK, the n-bit counter 12 provides the count data QC0 to QCn of n bits.

At the same time, the first signal generator 13A of the counting direction detector 13 receives the up/down indication signal S1 and reference clock signal CLK, and sends a first set signal SS1 or a first reset signal SR1 to the first data holder 13B, and as a result, the first data holder 13B holds the up direction signal S21 and maintains an output possible state of the up direction signal S21.

Also, the second signal generator 13C of the counting direction detector 13 receives the up/down indication signal S1 and reference clock signal CLK, and sends the second set signal SS2 or the second reset signal SR2 to the second data holder 13D, and as a result, the second data holder 13D holds the down direction signal S22 and maintains an output possible state of the down direction signal S22.

When identifying the up or down direction of rotation of a motor for a control of the position of the motor, a central processing unit (CPU) employing the counter circuit of the invention is not required to issue an interrupt request to process the count data QC0 to QCn of the counter but only to read the contents of the first and second data holders 13B and 13D.

Since the CPU is not required to calculate a difference of the count data, unlike the conventional technique, the load on the software of the CPU is reduced, and the ability thereof to execute other programs is enhanced. The present invention shortens the direction identification period, improves the speed of control of a moving object, and reduces the size of control programs.

BRIEF DESCRIPTION OF THE DRAWINGS

FIGS. 3(a) and 3(b) are views showing the principle of a counter circuit according to the invention;

FIGS. 4(a) and 4(b) are circuit diagrams showing a 4-bit up/down counter according to an embodiment of the invention;

FIG. 9 is a view showing a motor control system employing the counter circuit of the invention.

DESCRIPTION OF THE PREFERRED EMBODIMENTS

Figure 4B:
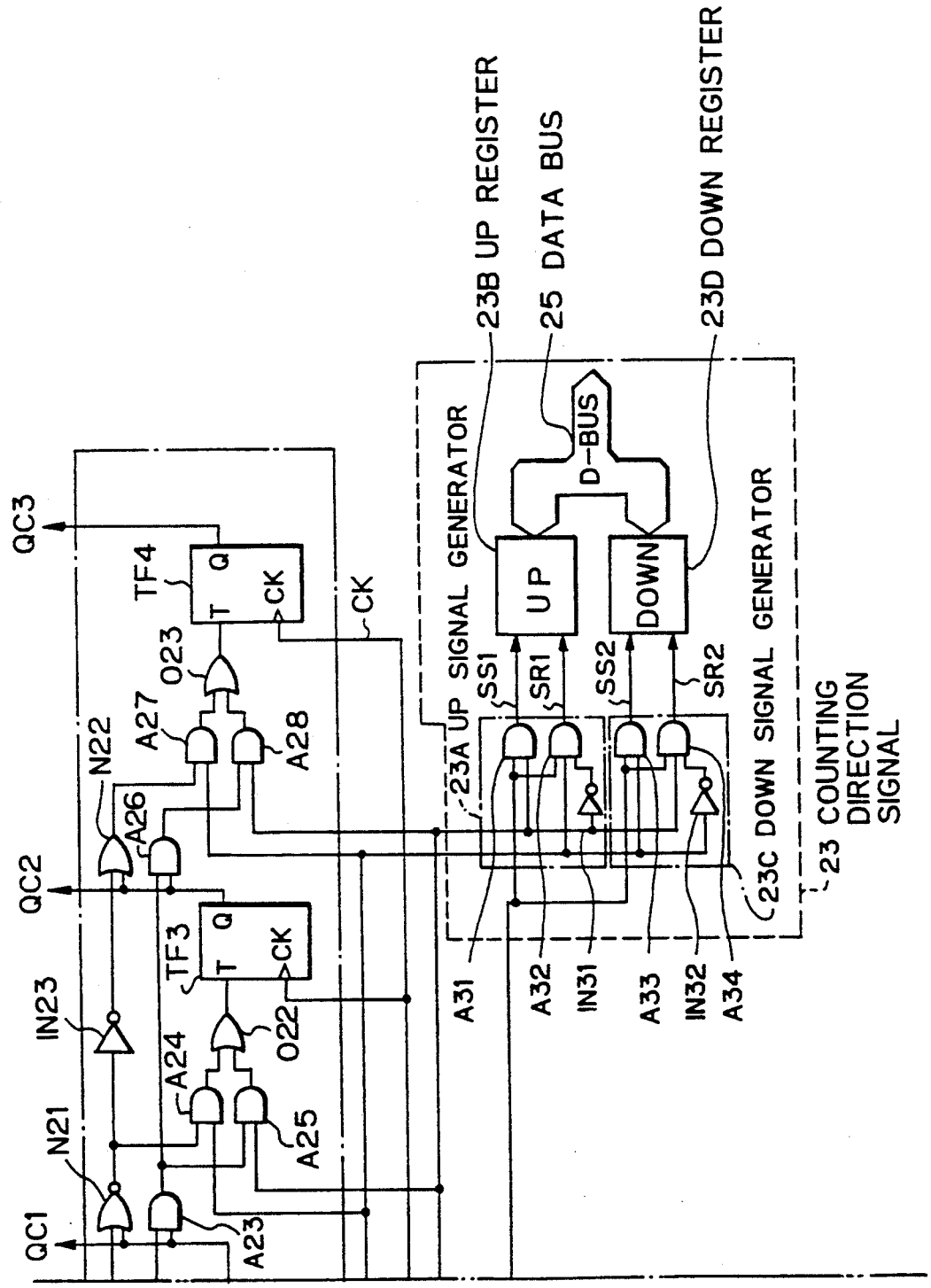

FIGS. 4(a) and 4(b) are circuit diagrams showing the principle of a counter 100 according to the invention.

Figure 1:
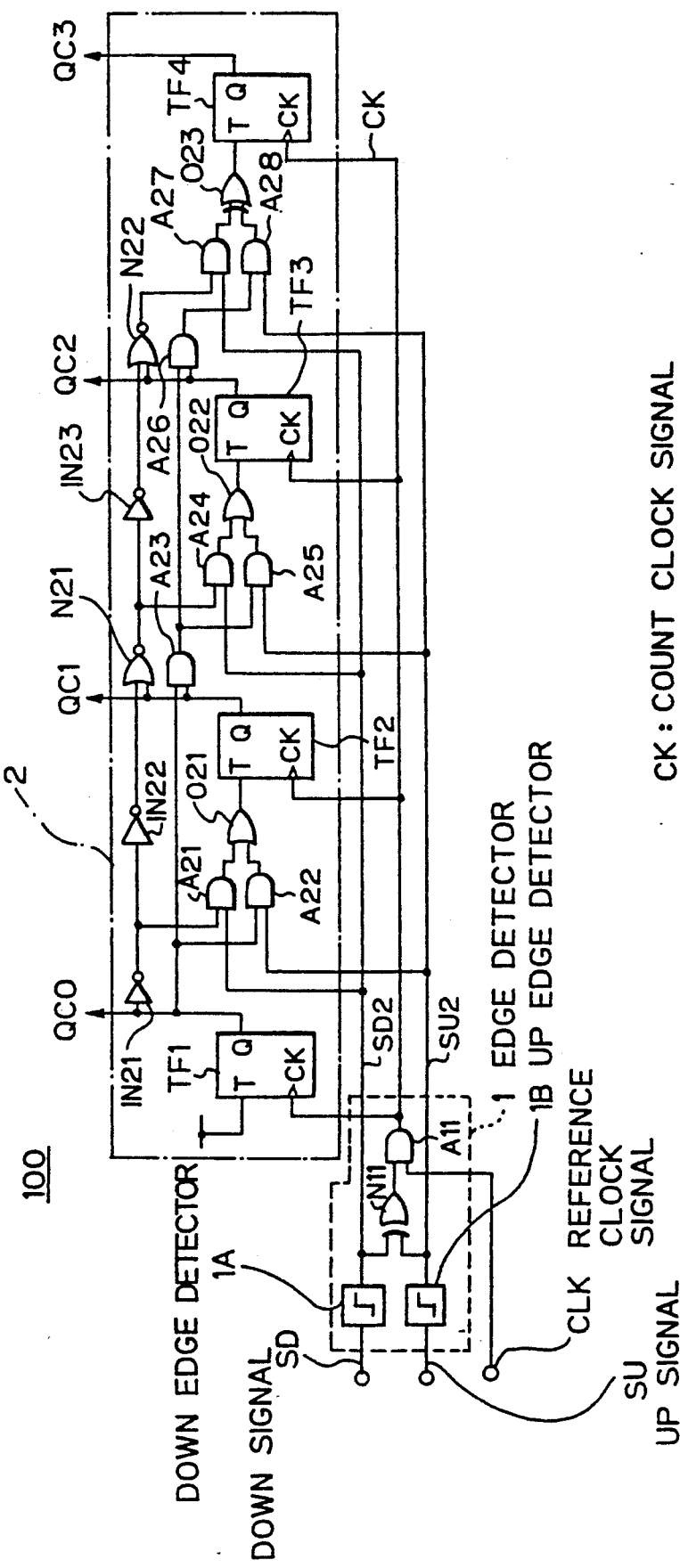
FIG. 1 is a circuit diagram showing an up/down counter according to a prior art.
Figure 2:
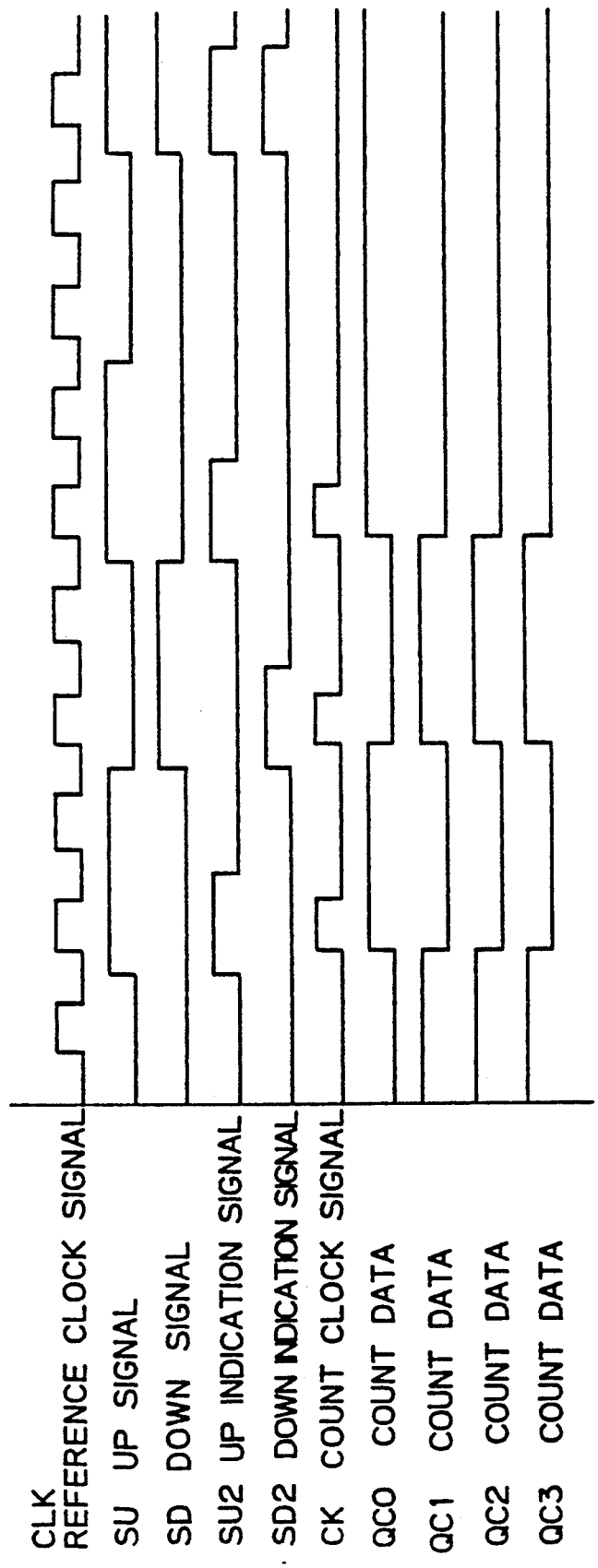
FIG. 2 is a time chart showing an operation of the up/down counter according to the prior art.
Figure 3A:
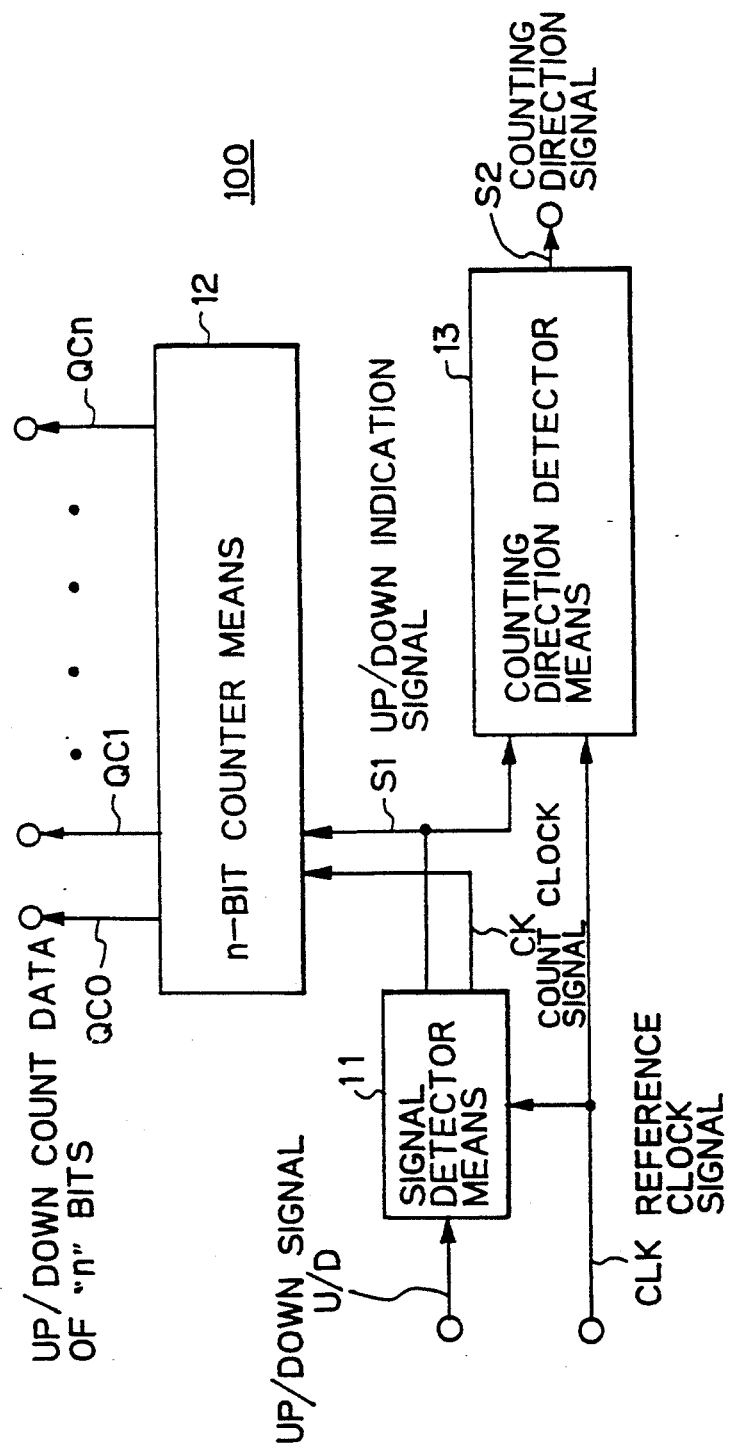

In FIG. 3(a), the counter 100 comprises a signal detector 11 for providing an up/down indication signal S1 and a count clock signal CK in response to an up/down signal U/D and a reference clock signal CLK; an n-bit counter 12 for providing count data of "n" bits QC0 to QCn according to the up/down indication signal S1 and count clock signal CK; and a counting direction detector 13 for providing a counting direction signal S2 according to the up/down indication signal S1 and reference clock signal CLK.

In FIG. 3(b), the counting direction detector 13 of the counter circuit 100 comprises a first signal generator 13A for providing a first set signal SS1 and a first reset signal SR1, a first data holder 13B for providing an up direction signal S21, a second signal generator 13C for providing a second set signal SS2 and a second reset signal SR2, and a second data holder 13D for providing a down direction signal S22.

Figure 5:
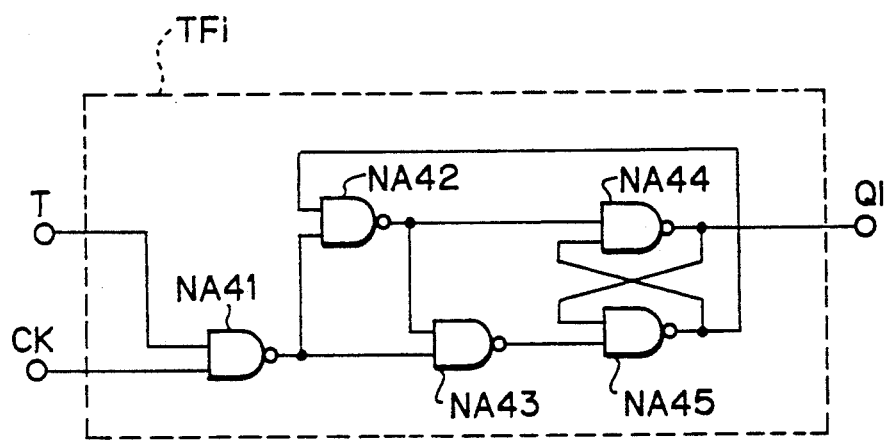
FIG. 5 is a circuit diagram showing a flip-flop according to the embodiment of the invention.
Figure 6:
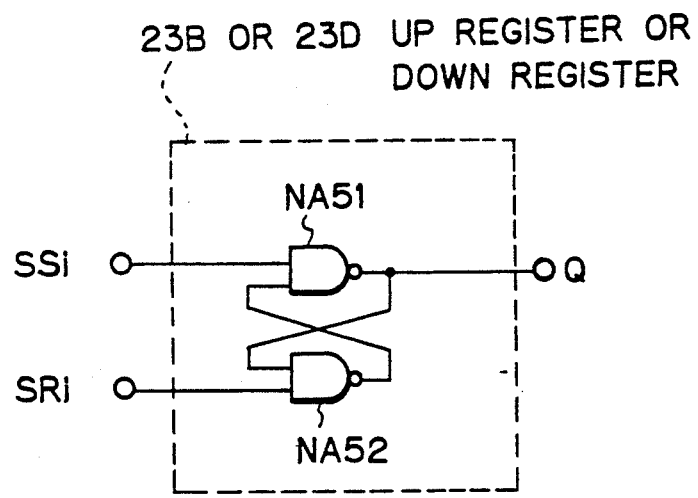
FIG. 6 is a circuit diagram showing an up/down flag holder according to the embodiment of the invention.

FIGS. 4(a&b) to 7 are views showing the details of the counter circuit 100 of the embodiment of the invention, in which FIGS. 4(a)-4(b) show a 4-bit up/down counter 22 of the embodiment, and FIGS. 5 and 6 are circuit diagrams showing flip-flops of the embodiment.

In FIG. 4(a), an edge detector 21 corresponding to the signal detector 11 of FIG. 3(a) comprises a down edge detector 21A, an up edge detector 21B, an EXOR logic circuit N11, and an AND logic circuit A11 to which an output of the circuit N11 and the signal CLK are input. The down edge detector 21A detects a rise of the waveform of a down signal SD, and supplies a down indication signal SD1 to the 4-bit up/down counter 22 and to the counting direction detector 23.

The up edge detector 21B detects a rise of the waveform of an up signal SU, and supplies an up indication signal SU1 to the 4-bit counter 22 and to the counting direction detector 23. The edge detectors 21A and 21B supply the down indication signal SD1, up indication signal SU1, and reference clock signal CLK to the NOR logic circuit N11 and AND logic circuit A11, to thereby produce a count clock signal CK which is supplied to the 4-bit counter 22 and to the direction detector 23.

The 4-bit counter 22 corresponding to the n-bit counter 12 of FIG. 3(a) comprises four T-type flip-flops TF1 to TF4, inverters IN21 to IN23 and NOR logic circuits N21 and N22 that detect a carry, and AND logic circuits A21 to A28 and OR logic circuits O21 to O23 that detect the up/down indication signals SU1 and SD1.

FIG. 5 shows the details of any one of the flip-flops TF1 to TF4. In the figure, the flip-flop comprises NAND logic circuits NA41 to NA43 for controlling the writing of count data Qi according to the count clock signal CK, and NAND logic circuits NA44 and NA45 for holding the count data.

In FIG. 4(b), counting direction detector 23 corresponding to the counting direction detector 13 of FIG. 3(a) comprises an up signal generator 23A corresponding to the first signal generator 13A to FIG. 3(b), an up register 23B corresponding to the first data holder 13B of FIG. 3(b), a down signal generator 23C corresponding to the second signal generator 13C of FIG. 3(b), and a down register. 23D corresponding to the second data holder 13D of FIG. 3(b).

The up signal generator 23A comprises an inverter IN31, and AND logic circuits A31 and A32. The up signal generator 23A receives the down indication signal SD1, up indication signal SU1, and reference clock signal CLK, and supplies an up-set signal SS1 or an up-reset signal SR1 to the up register 23B, which comprises, as shown in FIG. 6, NAND logic circuits NA51 and NA52 for holding an up flag UP in response to an up-set signal SSi and an up-reset signal SRi.

The down signal generator 23C comprises an inverter IN32, and AND logic circuits A33 and A34. The down signal generator 23C receives the down indication signal SD1, up indication signal SU1, and reference clock signal CLK, and supplies a down-set signal SS1 or a down-reset signal SR2 to the down register 23D. Similar to the up register 23B, the down register 23D holds a down flag DOWN in response to the down-set signal SS2 and the down-reset signal SR2.

Namely, the up/down counter of the embodiment of the invention is constituted is described above.

Each of the first and the second signal generator 13A, 13C is provided with a first input terminal to which an up-signal for counting-up the counter value is input and a second input terminal to which a down-signal for counting-down the counter value is input, respectively.

The first signal generator 13A, 23A comprises a first gate circuit A31 to which the reference clock signal CLK and an up-signal SU1 generated from said signal detector means 11, 21 are input and a second gate circuit A32 to which the reference clock signal CLK, a down-signal SD1 generated from the signal detector means 11, 21 and a reversed signal of the up-signal SU1 are input, while the second signal generator 13B, 23C comprises a third gate circuit A33 to which the reference clock signal CLK and a down-signal SD1 generated from the signal detector means are input and a fourth gate circuit A34 to which the reference clock signal CLK, an up-signal SU1 generated from the signal detector means and a reversed signal of the down-signal SD1 are input.

The first to fourth gate circuits used in the present invention are AND gage circuits.

On the other hand, the signal detector means 11 comprises an edge detector 21 and the edge detector 21 comprising a fifth gate circuit N11 to which an up-signal and a down-signal generated from an up edge detector 21A and a down edge detector 21B, respectively, are input to output an exclusive OR signal thereof and a sixth gate circuit A11 to which an output signal output signal output from said fifth gate circuit N11 and the reference clock signal CLK are input and outputting a counter clock signal CK.

In the present invention, the fifth gate circuit N11 is an exclusive OR gate circuit(EXOR) and the sixth gate circuit A11 is an AND gate circuit.

The n-bit counter means 22 of the present invention, comprises n-number of flip-flop circuits TF1~TFn each of which alternately outputs a high level signal and a low level signal, respectively, in response to the counter clock signal CK, a first logic circuit for counting up the count value of the n flip-flop circuits when the up-signal is input thereto and a second logic circuit for counting down the count value of said n flip-flop circuits when the down-signal is input thereto.

Each of the n-number of flip-flop circuits used in the present invention comprises T-type flip-flop circuit.

Moreover, the n-bit counter means further comprises a selecting circuit means for selecting any one of the first and second logic circuit in accordance with any one of the up-signal and down signal input thereto. In this embodiment, the first logic circuit comprises a circuit including an output Q of the flip-flop circuit TF1 and AND gates (A23, A26) and the second logic circuit comprises a circuit including an output Q of the flip-flop circuit TF1 and inventors (IN21, IN22, IN23) and NOR gates (N21, N22), while the selecting circuit comprises AND gates (A21, A22) and OR gate O21, (AND gates (A24, A25) and OR gate O22), (AND gates (A27, A29) and OR gate O23).

The up/down signal U/D received by the up/down counter of the invention may be of any kind as long as the counter is able to detect the direction of movement of a moving object and generate a signal indicating that direction. Also, a means for generating the up/down signal U/D may be of any kind; for example, it may be an encoder disclosed in, "Design of Control Circuit for DC Motor", by the CQ Publishing Company and author Kinji Tanikoshi.

Figure 8:
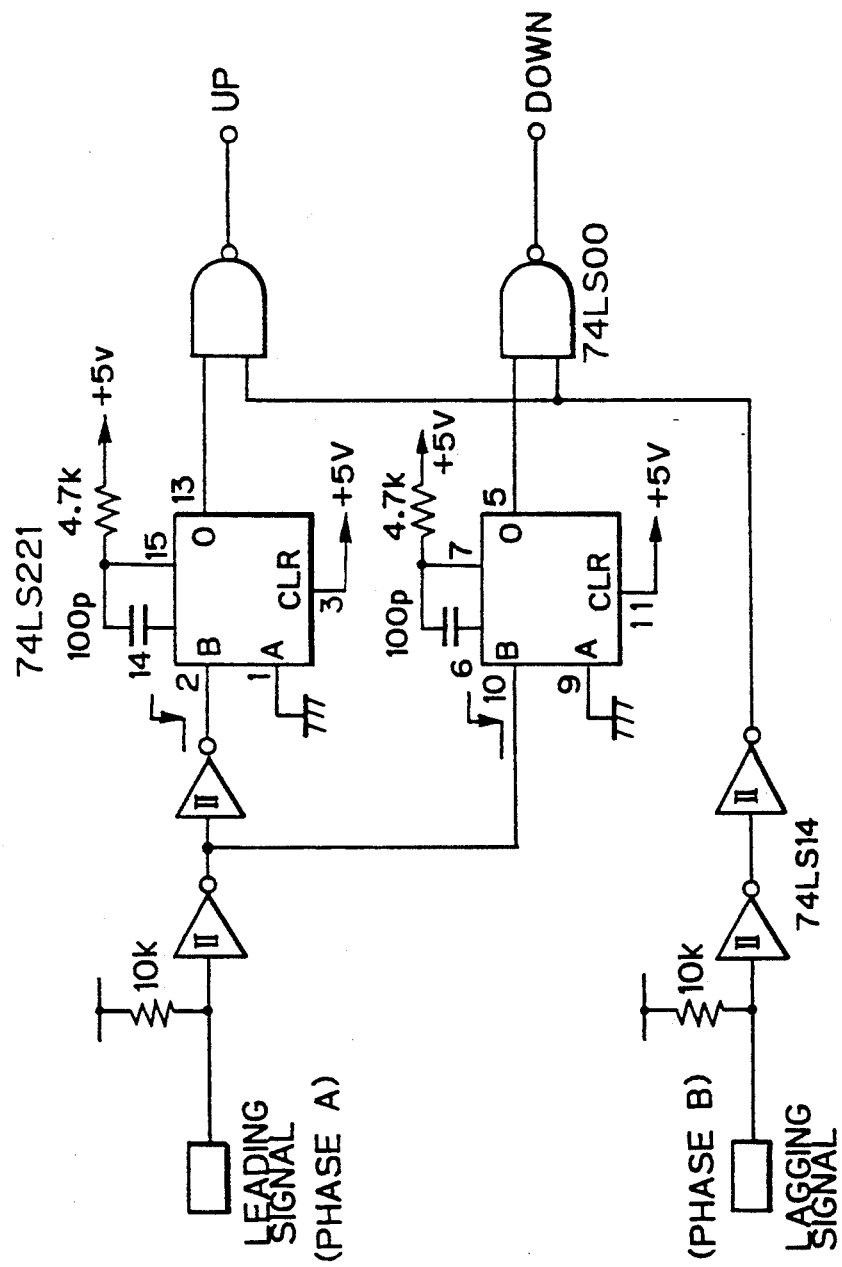
FIG. 8 is a view showing an example of up/down signal generator employed by the invention.

FIG. 8 shows an example of the signal generator for generating the up/down signal used for the up/down counter of the invention. In this figure, the signal generator is an encoder that provides digital signals containing the positional and directional information of a motor. The encoder generates an up signal or a down signal related to the direction of rotation of the motor according to a leading signal (phase A) and a lagging signal (phase B).

The up/down signal U/D used for the invention preferably includes three pieces of information, i.e., a count-up, a count-down, and a no-count, and these pieces of information must be correctly transferred. If a single input line is used for the up/down signal, a ternary signal is preferable. According to the invention, two input signal lines may be employed, provided that the proper processes are carried out for the input signal lines. In the simplest case, three input lines may be employed.

Next, an operation of the up/down counter circuit of the invention will be explained.

Figure 7:
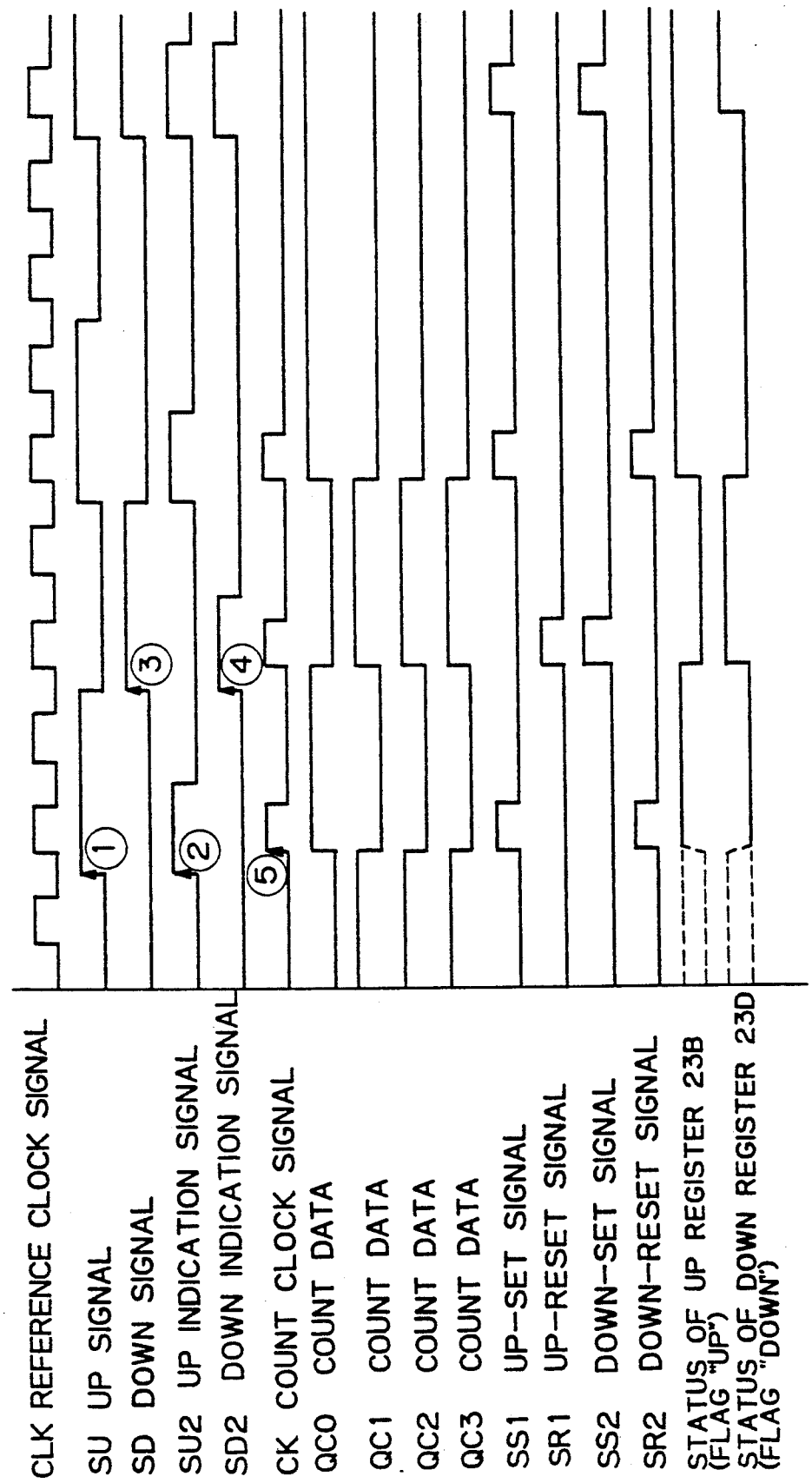
FIG. 7 is a time chart showing an operation of the up/down counter according to the embodiment of the invention.

FIG. 7 is a time chart of the up/down counter according to the embodiment of the invention. It is assumed that the up/down counter is used for controlling the position of a motor, and that the circuit has just received the basic clock signal CLK, up signal SU and down signal SD.

The up edge detector 21B detects a rise (1) of the up signal SU, and generates an up indication signal SU1 (2); the down edge detector 21C detects a rise (3) of the down signal SD, and generates a down indication signal SD1 (4); and the NOR logic circuit N11 and AND logic circuit A11 process the reference clock signal CLK, up indication signal SU1, and down indication signal SD1, and generates a count clock signal CK.

The up indication signal SU1, down indication signal SD1, and count clock signal CK are fed to the 4-bit counter 22-and to the counting direction detector 23, and the 4-bit counter 22 provides count data QC0 to QC3 according to the count clock signal CK.

In the counting direction detector 23, the up signal generator 23A receives the down indication signal SD1, up indication signal SU1, and reference clock signal CLK, and provides the up register 23B with an up-set signal SS1 or an up-reset signal SR1, and as a result, the up register 23B holds an up flag UP according to the up-set signal SS1=H (high level) and the up-reset signal SR1=L (low level).

Further, the down signal generator 23C receives the down indication signal SD1, up indication signal SU1, and reference clock signal CLK, and provides the down register 23D with a down-set signal SS2 or a down-reset signal SR2, and as a result, the down register 23D holds a down flag DOWN according to the down-set signal SS2= L and the down-reset signal SR2=H, similar to the up register 23B.

Thereafter, by reading the contents of the registers 23B and 23D through a data bus 25, the CPU can detect the count-up or count-down direction of the counter 22.

This embodiment of the invention employs the counting direction detector 23 comprising the up signal generator 23A, up register 23B, down signal generator 23C, and down register 23D.

In this arrangement, the up register 23B holds the up flag UP and maintains an output possible state of the flag UP=H. The down register 23D holds the down flag DOWN and maintains an output possible state of the flag DOWN=L. When controlling the position of the motor, the CPU reads the up flag UP and down flag DOWN from the up register 23B and down register 23D, and identifies the direction of rotation of the motor.

Unlike the conventional techniques, the present invention does not require a calculation of a difference in the count data QC0 to QC3, and therefore, a load on the software of the CPU can be reduced and the execution of other programs enhanced.

The embodiment of the invention clearly determines the counting direction of the counter 22, i.e., whether it is in a count-up state or in a count-down state, according to the up/down signal U/D. It is also possible, according to the invention, to identify a neutral state of the up/down signal U/D, where the counting direction of the counter 22 is uncertain. An output possible state of the neutral state will be maintained when the up flag UP=H and the down flag DOWN=H, and in this case, an alarm may be displayed or sounded. With this arrangement, the CPU can identify a neutral state, i.e., a halt of a rotation of the motor at which a motor rotating direction changes from normal to reverse, or from reverse to normal.

FIG. 9 shows an example of systems employing the up/down counter circuit of the invention, for controlling the rotation of a moving object such as a motor.

In the figure, a shaft encoder 91 detects the direction of rotation of a DC motor 90, and provides an encoder 92 with three phase signals for phases A, B, and Z. The phase signal for the phase Z need not always be used, depending on the kind of information to be detected. An output signal of the encoder 92 is transferred to an up-/down signal input port of the counter circuit 100 of the invention made of an integrated circuit, and then to the signal detector 11 of the counter 100. According to a reference clock signal CLK, the signal detector 11 processes the received signal as mentioned before, and provides an up/down indication signal. The n-bit counter 12 of the counter 100 provides up/down calculation data QC0 to QC3, which are transferred to a proper computation means (CPU) 93 through a data bus 99, and at the same time, the counting direction detector 13 of the counter 100 stores the up/down indication signal in a register serving as a memory.

As and when requested, the CPU reads the up/down information stored in the counting direction detector 13, and provides a power amplifier 98 of the motor 90 with the up/down information through a D/A converter 94, to thereby control the speed of the motor, and at the same time, the CPU provides the power amplifier 98 with the same information through an output port 95, to thereby control the direction of rotation of the motor.

According to the invention, the counter circuit 100, CPU 93, D/A converter 94, output port 95, etc., are formed on a microcomputer chip 97.

As explained above, the invention employs a counting direction detector comprising first and second signal generators, and first and second data holders, and provides an up direction signal or a down direction signal according to an up/down indication signal and a reference clock signal.

When there is a need to identify, for example, the direction of rotation of a motor, the position of which is to be controlled, a central processing unit reads and processes the contents of the first and second data holder of the counter circuit of the invention, and according to the read and processed information, can easily detect an up or a down direction of the rotation. This arrangement reduces the load on the software of the CPU.

Namely, the invention determines the direction of rotation of a moving object in a short time, and thus improves the speed of the control of the moving object and reduces the size of a control program.

I claim:

1. A counter circuit comprising:
    a signal detector means for providing an up/down indication signal and a count clock signal according to an up/down signal and a reference clock signal input thereto;
    an n-bit counter means, connected to said signal detector means, for providing up/down count data of "n" bits according to the up/down indication signal and count clock signal; and
    a counting direction detector means, connected to said signal detector means and said reference clock signal input, for providing a counting direction signal according to the up/down indication signal and reference clock signal.

2. A counter circuit as set forth in claim 1, wherein said counting direction detector means includes:
    a first signal generator for providing a first set signal and a first reset signal in response to the up/down indication signal and reference clock signal;
    a first data holding means for receiving the first set signal and first reset signal and providing an up direction signal;
    a second signal generator for providing a second set signal and a second reset signal in response to the up/down indication signal and reference clock signal; and
    a second data holding means for receiving the second set signal and second reset signal and providing a down direction signal.

3. A counter circuit according to claim 2, wherein each of said first and second signal generator is provided with a first input terminal to which an up-signal for counting-up the counter value is input and a second input terminal to which a down-signal for counting-down the counter value is input, respectively.

4. A counter circuit according to claim 2, wherein said first signal generator comprises a first gate circuit to which said reference clock signal and an up-signal generated from said signal detector means are input and a second gate circuit to which said reference clock signal, a down-signal generated from said signal detector means and a reversed signal of said up-signal are input, while said second signal generator comprises a third gate circuit to which said reference clock signal and a down-signal generated from said signal detector means are input and a fourth gate circuit to which said reference clock signal, an up-signal generated from said signal detector means and a reversed signal of said down-signal are input.

5. A counter circuit according to claim 4, wherein said first to fourth gate circuits are AND gate circuits.

6. A counter circuit according to claim 1, wherein said signal detector means comprises an edge detector and said edge detector comprising a fifth gate circuit to which an up-signal and a down-signal generated from an up edge detector and a down edge detector respectively are input to output an exclusive OR signal thereof and a sixth gate circuit to which an output signal output from said fifth gate circuit and said reference clock signal are input and outputting a counter clock signal.

7. A counter circuit according to claim 6, wherein said fifth gate circuit is an exclusive OR gate circuit (EXOR) and said sixth gate circuit is an AND gate circuit.

8. A counter circuit according to claim 6, wherein said n-bit counter means comprises n-number of flip-flop circuits each of which alternately outputs a high level signal and a low level signal respectively in responce to said counter clock signal, a first logic circuit for counting up the count value of said n flip-flop circuits when said up-signal is input thereto and a second logic circuit for counting down the count value of said n flip-flop circuits when said down-signal is input thereto.

9. A counter circuit according to claim 8, wherein each of said n-number of flip-flop circuits comprises T-type flip-flop circuit.

10. A counter circuit according to claim 8, wherein said n-bit counter means further comprises a selecting circuit means for selecting any one of said first and second logic circuit in accordance with any one said up-signal and down signal input thereto.

11. A counter circuit according to claim 1, wherein said counting direction detector means is connected to a processing means through a data base to thereto of a condition of a counting direction.

12. A counter circuit comprising:
 a signal detector means for providing an up/down indication signal and a count clock signal according to an up/down signal and a reference clock signal;
 an n-bit counter means for providing up/down count data of "n" bits according to the up/down indication signal and count clock signal; and
 a counting direction detector means for providing a counting direction signal according to the up/down indication signal and reference clock signal, said counting direction detector includes
 a first signal generator for providing a first set signal and a first reset signal in response to the up/down indication signal and reference clock signal,
 a first data holding means for receiving the first set signal and first reset signal and providing an up direction signal,
 a second signal generator for providing a second set signal and a second reset signal in response to the up/down indication signal and reference clock signal, and
 a second data holding means for receiving the second set signal and second reset signal and providing a down direction signal.

* * * * *